United States Patent
Calderon et al.

(10) Patent No.: US 9,438,376 B2
(45) Date of Patent: Sep. 6, 2016

(54) APPARATUS AND METHOD FOR FORWARD ERROR CORRECTION OVER A COMMUNICATION CHANNEL

(71) Applicant: CORTINA SYSTEMS, INC., Sunnyvale, CA (US)

(72) Inventors: Juan-Carlos Calderon, Fremont, CA (US); Jean-Michel Caia, Plymouth, CA (US); Arash Farhoodfar, Sunnyvale, CA (US); Arun Zarabi, Sacramento, CA (US)

(73) Assignee: Cortina Systems, Inc., Sunnyvale, CA (US)

( * ) Notice: Subject to any disclaimer, the term of this patent is extended or adjusted under 35 U.S.C. 154(b) by 49 days.

(21) Appl. No.: 14/211,938

(22) Filed: Mar. 14, 2014

(65) Prior Publication Data

US 2014/0270780 A1    Sep. 18, 2014

Related U.S. Application Data

(60) Provisional application No. 61/791,697, filed on Mar. 15, 2013.

(51) Int. Cl.
| | |
|---|---|
| *H04B 10/00* | (2013.01) |
| *H04B 10/08* | (2006.01) |
| *H04L 1/00* | (2006.01) |
| *H04B 10/516* | (2013.01) |
| *H04B 10/07* | (2013.01) |

(52) U.S. Cl.
CPC ........... *H04L 1/0042* (2013.01); *H04B 10/516* (2013.01); *H04L 1/0061* (2013.01); *H04B 10/07* (2013.01)

(58) Field of Classification Search
None
See application file for complete search history.

(56) References Cited

U.S. PATENT DOCUMENTS

| | | | | |
|---|---|---|---|---|
| 9,231,721 | B1* | 1/2016 | Varadarajan | H04J 3/1652 |
| 2003/0120799 | A1* | 6/2003 | Lahav | H04J 3/1611 709/236 |
| 2003/0123493 | A1* | 7/2003 | Takahashi | H04J 3/1611 370/539 |
| 2005/0053285 | A1* | 3/2005 | Linkewitsch | H04J 3/0605 382/232 |
| 2009/0074410 | A1* | 3/2009 | Zou | H04J 3/1652 398/52 |
| 2010/0008678 | A1* | 1/2010 | Caggioni | H04J 3/1652 398/158 |
| 2010/0232786 | A1* | 9/2010 | Aoki | H04J 3/1658 398/19 |
| 2010/0281343 | A1* | 11/2010 | Caggioni | H03M 13/05 714/776 |
| 2015/0139650 | A1* | 5/2015 | Su | H04B 10/25 398/66 |

OTHER PUBLICATIONS

Cruz, Jose R.C., Error Correction with Reed-Solomon, Jun. 2013, http://www.drdobbs.com/testing/error-correction-with-reed-solomon/240157266.*
ITU-T, Interfaces for the Optical Transport Network (OTN), Feb. 2012, Recommendation ITU-T G.709/Y.1331.

* cited by examiner

*Primary Examiner* — Ken N Vanderpuye
*Assistant Examiner* — Jai Lee
(74) *Attorney, Agent, or Firm* — Amin, Turocy & Watson, LLP

(57) ABSTRACT

There are various drawbacks by using existing OTN (Optical Transport Network) frames for communication between OTN cards. Such drawbacks might for example include high latency, low robustness, and/or high coding rate. According to embodiments of the present disclosure, systems and methods are provided for modifying an OTN frame (or creating a new frame with data from the OTN frame) prior to transmission by an OTL (Optical channel Transport Lane) in order to address some or all of the foregoing drawbacks. Note that this embodiment can make use of existing hardware (e.g. hardware used for generating the OTN frame, and the OTL used for transmission).

23 Claims, 12 Drawing Sheets

APPARATUS AND METHOD FOR FORWARD ERROR CORRECTION OVER A COMMUNICATION CHANNEL

RELATED APPLICATION

This application claims priority from U.S. Provisional Patent Application No. 61/791,697 filed on Mar. 15, 2013, the entire contents of which are incorporated by reference.

FIELD OF THE DISCLOSURE

The present disclosure relates to communication systems, and more particularly to communicating data over a communication channel.

BACKGROUND

A transmitter can transmit a signal to a receiver over a communication channel such as a backplane. The signal can encode various data. If the communication channel is not perfect, then the signal received by the receiver may not be identical to the signal transited by the transmitter. For instance, the communication channel may have introduced noise into the signal. If the signal received by the receiver is distorted enough by the communication channel, then the data may not be recoverable by the receiver.

FEC (Forward Error Correction) or channel coding is a technique that involves encoding a signal in a redundant manner so that data sent with the signal may be recoverable even if there are errors in transmission. Such techniques may be employed when it is difficult or impractical to support re-transmission of data following an error. RS (Reed Solomon) encoding is an example FEC. Other FECs exist.

BRIEF DESCRIPTION OF THE DRAWINGS

Embodiments of the present disclosure will now be described with reference to the attached drawings in which:

FIGS. 2A through 2D are example OTN frames that may be communicated between the OTN cards shown in FIG. 1;

DETAILED DESCRIPTION OF EMBODIMENTS

It should be understood at the outset that although illustrative implementations of one or more embodiments of the present disclosure are provided below, the disclosed systems and/or methods may be implemented using any number of techniques, whether currently known or in existence. The present disclosure should in no way be limited to the illustrative implementations, drawings, and techniques illustrated below, including the exemplary designs and implementations illustrated and described herein, but may be modified within the scope of the appended claims along with their full scope of equivalents.

There are various drawbacks by using existing OTN frames for communication between OTN cards. Such drawbacks might for example include high latency, low robustness, and/or high transmission rate. According to embodiments of the present disclosure, systems and methods are provided for modifying an OTN frame (or creating a new frame with data from the OTN frame) prior to transmission by an OTL in order to address some or all of the foregoing drawbacks. Note that this embodiment can make use of existing hardware (e.g. hardware used for generating the OTN frame, and the OTL used for transmission). Other aspects and features of the present disclosure will become apparent, to those ordinarily skilled in the art, upon review of the following description of the specific embodiments of the invention.

Introduction

Figure 1:
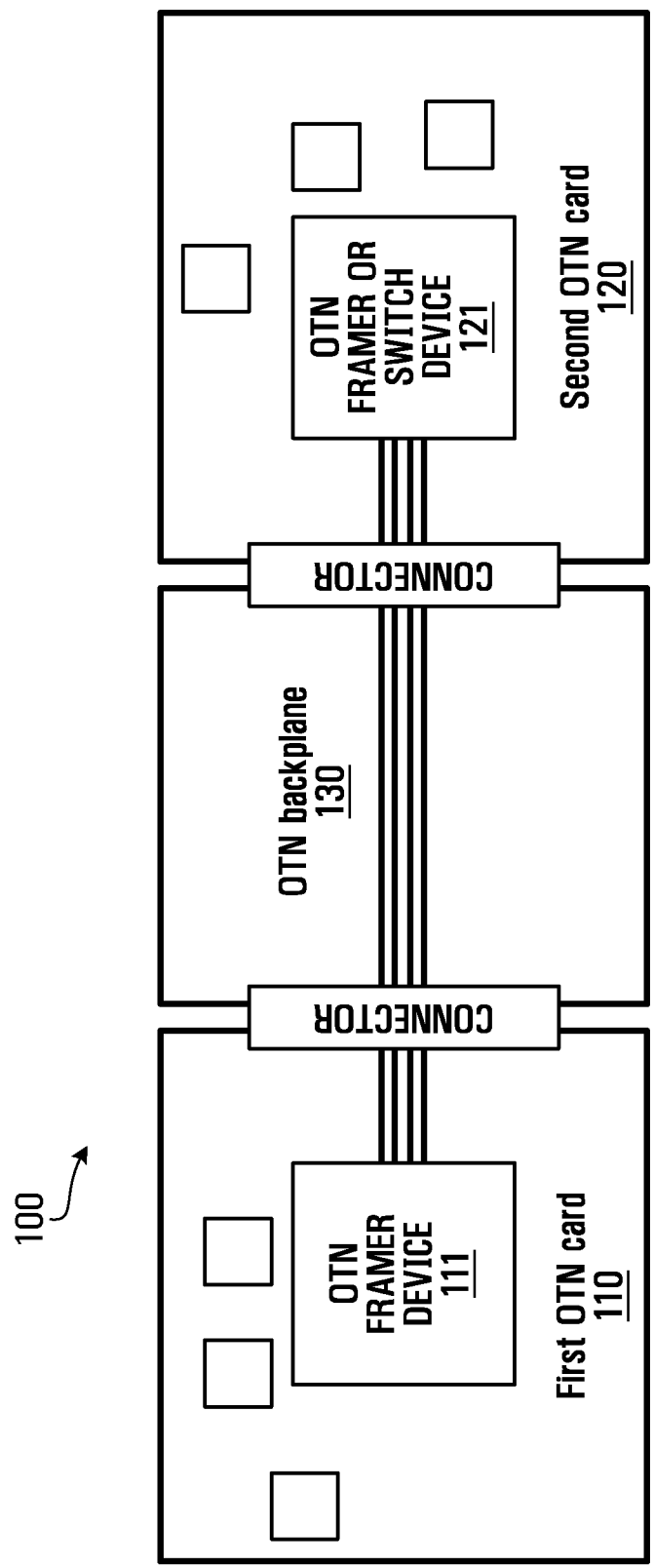
FIG. 1 is a block diagram of OTN (Optical Transport Network) system having first and second OTN cards connected via an OTN backplane.

Referring first to FIG. 1, shown is a block diagram of an OTN system 100 having first and second OTN cards 110,120 connected via an OTN backplane 130. Each OTN card 110,120 has an OTN framer device 111,121 or a switch device 121 as shown in the illustrated example. As an alternative to the switch device 121, there may be an FPGA (Field Programmable Gate Array) and/or other circuitry not specially shown. The block diagram of FIG. 1 is a simplified and generalized view of an OTN DWDM (Dense Wavelength Division Multiplexing) system and is applicable to many different applications: transponder or muxponder applications (e.g. both of the OTN cards 110,120 are OTN line cards interconnected through the OTN backplane 130), optical transmission (e.g. the first OTN card 110 on the left contains the OTN framer device 111 and the OTN card 121 on the right contains circuitry for optics), or even an OTN cross-connect (e.g. the first OTN card 110 on the left is an OTN line card and the second OTN card 120 on the right is an OTN switch card having the switch device 121).

Each OTN framer device 111,121 (or switch device, FPGA, other circuitry, etc.) is configured to generate OTN frames, which can be transmitted across the backplane 130 thereby enabling communication between the OTN cards 110,120. One OTN framer device 111 can operate as a transmitter (i.e. encoding an FEC) with the other OTN framer device 121 operating as a receiver (i.e. decoding the FEC). Note that both OTN framer devices 111,121 may be capable of operating as a transmitter and a receiver. In some implementations, both OTN framer devices 111,121 contain high-speed interfaces (e.g. analog design) to serialize information at high speed rates (e.g. ~27 Gbps). In some implementations, the OTN framer devices have a DFE (Decision Feedback Equalizer) that can be used to implement the high-speed interface for receiving data.

Figure 2A:
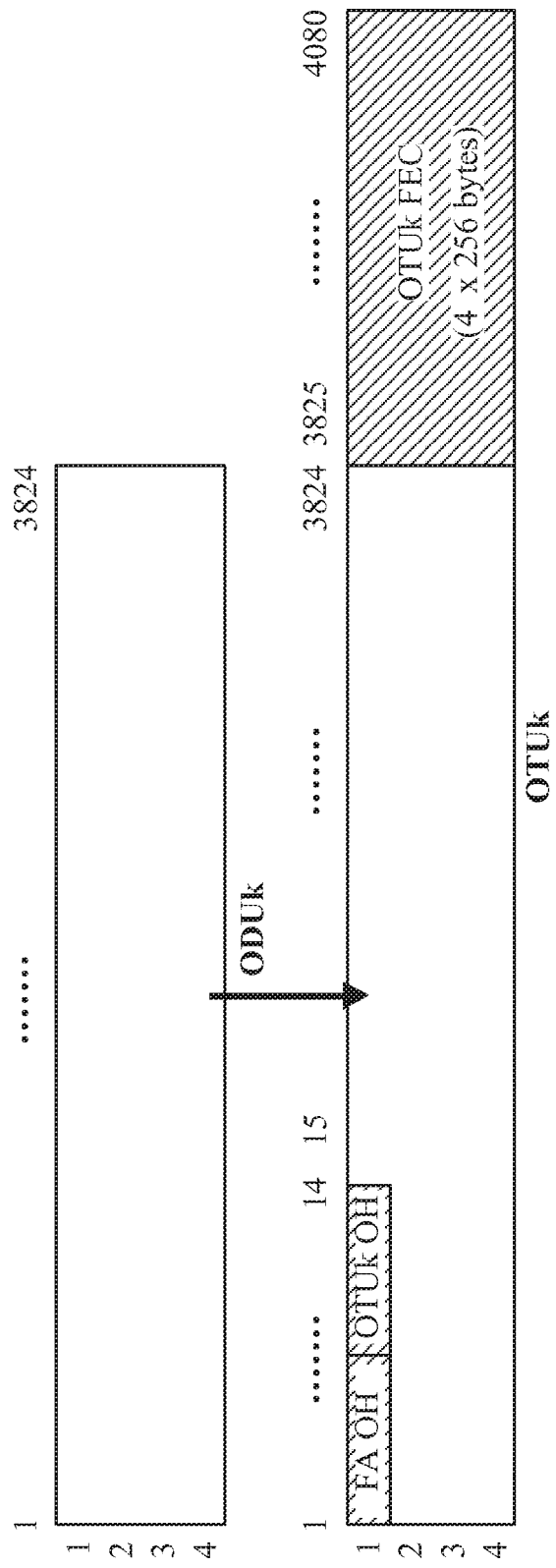
Figure 2B:
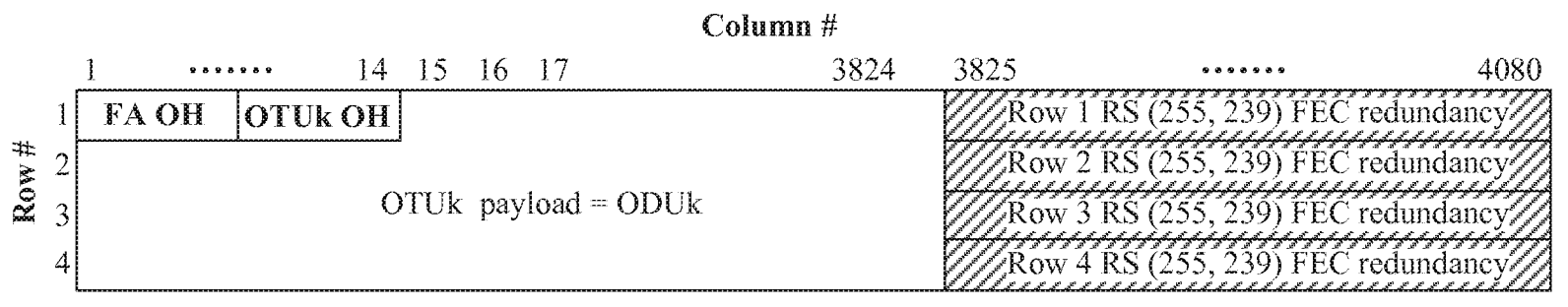
Figure 2C:
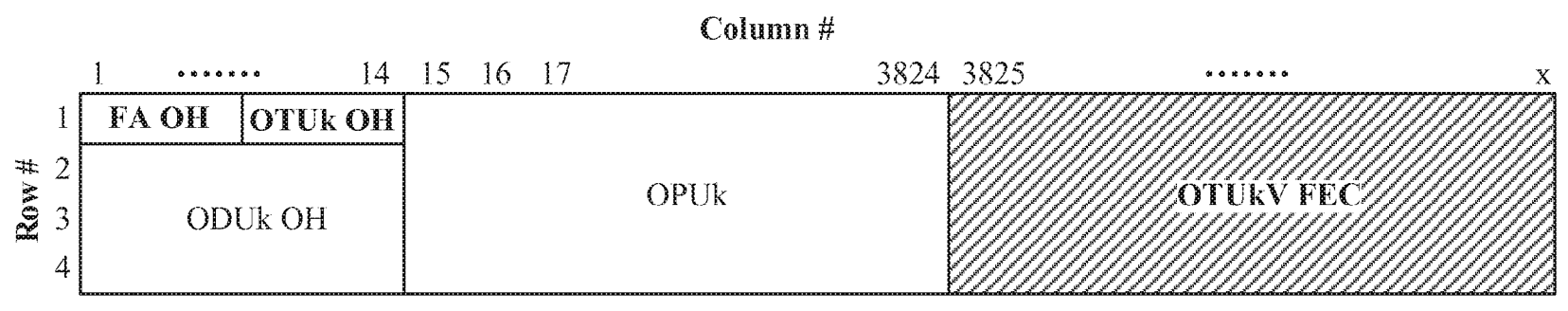
Figure 2D:
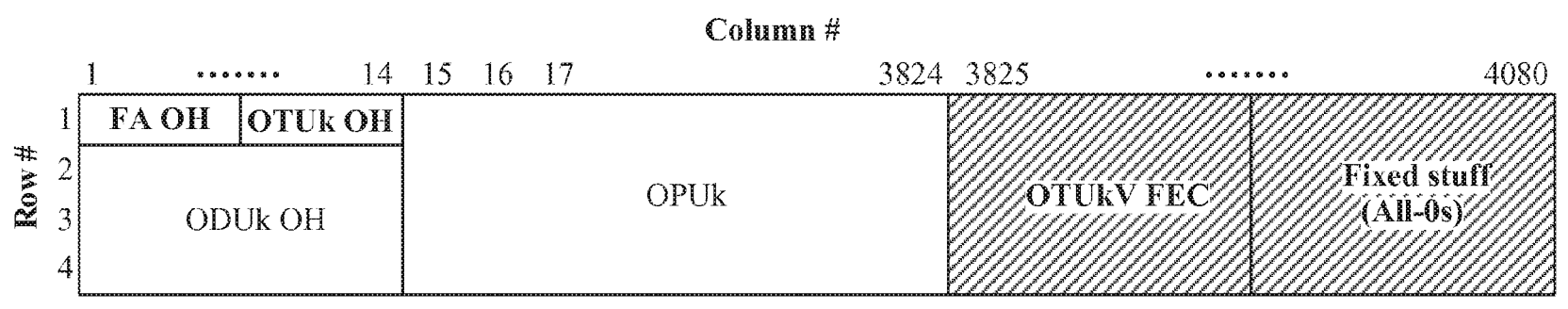

Referring now to FIGS. 2A through 2D, shown are example OTN frames that may be communicated between the OTN cards. OTUk (Optical channel Transport Unit[1]) frames, as standardized by ITU (International Telecommunication Union) G.709[2] and shown in FIGS. 2A and 2B, use RS (255,238,m=8,t=8) FEC providing a 6.7% FEC overhead redundancy. Further details are provided in Annex A of ITU G.709. Appendix II of ITU G.709 provides multiple generic examples of functionally standardized OTU frame structures (OTUkV) for illustrative purpose with different FEC redundancy. For example, in Appendix II of ITU G.709, there is a case of an OTUk with a larger OTUkV FEC, as per FIG. 2C, where X is assumed to be greater than 4080. There is also a case of an OTUk with a smaller OTUkV FEC and remainder of FEC area filled with fixed stuff as shown in FIG. 2D.

[1] k (=1,2,3,4) indicates rate (e.g. OTU1=10 Gbps, OTU2=10 Gbps, OTU3=40 Gbps, OTU4=100 Gbps)
[2] ITU-T Recommendation G.709 "Interfaces for the Optical Transport Network (OTN)" (February 2012) is incorporated by reference in its entirety.

However, there are various drawbacks by using the existing OTN frames for communication between the OTN cards. As shown in the illustrated examples, each OTN frame has FEC parity at the end of each row of the OTN frame. This can result in poor latency because all data in a row would be received before any processing with the FEC parity can be started. For instance, for some backplane applications (e.g. transport of Fibre Channel client signals), GFEC (G.709 FEC) latency is too large. Another drawback is the interaction between the G.709 FEC and the OTLk.n, which can result in poor robustness if there are burst errors. For instance, when a standard G.709 FEC—RS (255, 239, m=8, t=8)—is combined with OTL, the result is very low tolerance to correlated errors (i.e. a small burst can corrupt many symbols of the same codeword, thus significantly lowering Net Coding Gain). Another drawback of using the G.709 FEC over backplane is that its coding rate is relatively high (6.7%), reducing the maximum backplane length.

One approach could be to modify the OTN framer devices and the OTL in an attempt to address some or all of the foregoing drawbacks. However, since the OTN framer devices and the OTL already exist, this approach may not be desirable. Many 100 G OTN applications (OTU4) and future "beyond 100 G" OTN applications (OTUCn) may one day use an FEC method for backplanes, but an FEC method designed for an OTN backplane has not yet been developed and standardized.

According to embodiments of the present disclosure, systems and methods are provided for modifying an existing OTN frame (or creating a new frame with data from the OTN frame) prior to transmission by the OTL in order to address some or all of the foregoing drawbacks with the existing OTN frames. Note that these embodiments can make use of existing hardware (e.g. reuse the OTN framer devices and/or the OTL).

FEC Encoder/Decoder: Overview

Figure 3:
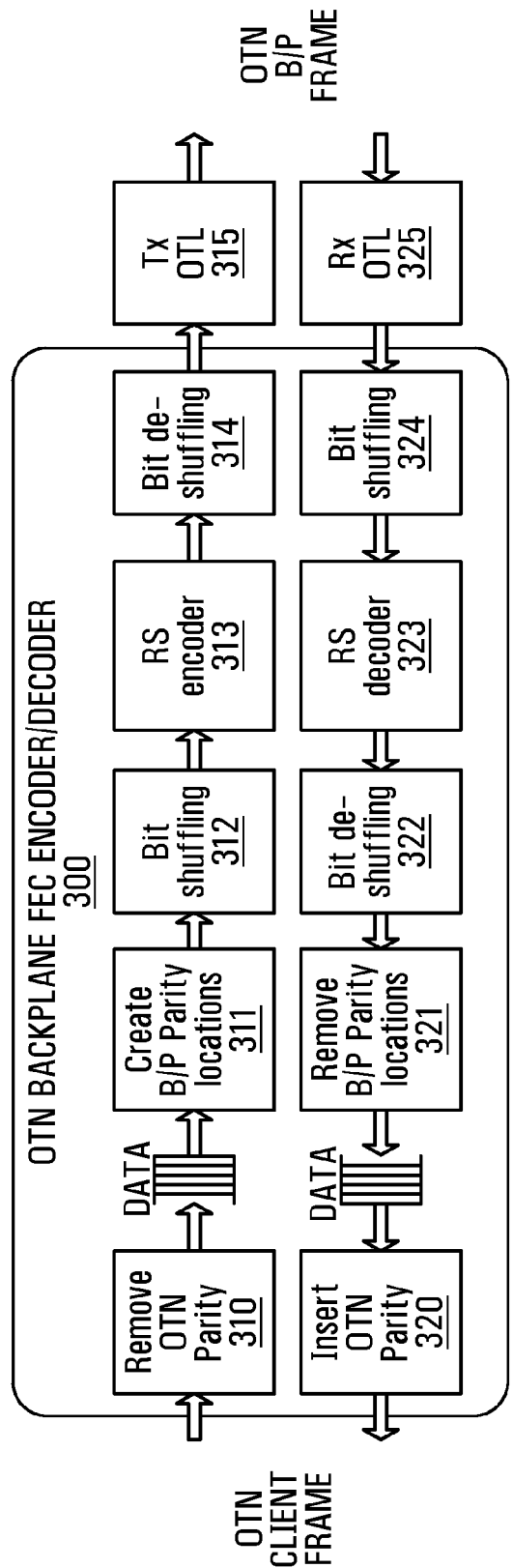
FIG. 3 is a block diagram of an FEC encoder/decoder for transmitting/receiving data over an OTL (Optical channel Transport Lane), in accordance with various embodiments of the present disclosure.

Referring now to FIG. 3, shown is a block diagram of an FEC encoder/decoder 300 in accordance with an embodiment of the present disclosure. The FEC encoder/decoder 300 has a transmit path 310,311,312,313,314 corresponding to a transmitting OTL 315, and a receive path 320,321,322, 323,324 corresponding to a receiving OTL 325. The transmit path 310,311,312,313,314 includes:

circuitry 310 for removing FEC parity from an OTN frame (and optionally removing OTN FAS bytes—Frame Alignment Signal),
circuitry 311 for re-structuring data from the OTN frame and creating FEC parity locations (and optionally inserting the backplane FAS bytes if they were removed by the circuitry 310) for a new backplane frame format,
circuitry 312 for bit shuffling the data,
circuitry 313 for coding the data to determine the FEC parity, and
circuitry 314 for bit de-shuffling the data prior to the new frame being transmitted by the OTL.

The receive path 320,321,322,323,324 has circuitry that is complementary to the transmit path 310,311,312,313,314.

Data is coded in such a way that compensates for bit shuffling done by the OTL 315. To this end, the circuitry 312 bit shuffles the data prior to the coding, and the circuitry 314 bit de-shuffles the data after the coding. In some implementations, this is performed such that there is striping at a symbol level across the backplane lanes as will be described in further detail below. In the illustrated example, the circuitry 313 for coding the data is an RS encoder 313, although alternative encoders other than the RS encoder 313 may be possible.

There are many possible codes that can be used by the RS encoder 313. In a "first embodiment", the RS encoder uses an RS (627,613,m=10,t=7) code. In a "second embodiment", the RS encoder uses an RS (528,514,m=10,t=7) code. In a "third embodiment", the RS encoder uses an RS (970,956, m=10,t=7) code. These three embodiments will be described in further detail below. Other embodiments are possible and are within the scope of the present disclosure.

In some implementations, the OTN FAS bytes are not removed and are reused directly as FAS bytes for the backplane frame. However, in other implementations, the OTN FAS bytes are removed by the circuitry 310 and inserted by the circuitry 311. Other implementations are possible and are within the scope of the present disclosure.

Further details of the transmit path 310,311,312,313,314 and its operation, including further details of the "first embodiment", "second embodiment" and "third embodiment" noted above, are provided with reference to the subsequent Figures. The receive path 320,321,322,323,324 and its operation are complementary to the transmit path 310,311,312,313,314 and its operation. Thus, further details of the receive path 320,321,322,323,324 and its operation may not be explicitly provided. However, it is to be understood that the receive path 320,321,322,323,324 and its operation are within the scope of the present disclosure.

FEC Encoder/Decoder: First Embodiment

According to the first embodiment, data of an OTN frame (for example, an OTN frame with a 255/239 FEC redundancy) is re-structured into another OTN frame (the backplane frame) with a 245/239 FEC redundancy. The backplane frame is structured similarly to a standard OTN frame: 245 column groups and four rows. Twenty RS (627,613, m=10,t=7) codewords are mapped into each backplane frame (five codewords per row). A FIFO is used for the re-structuring. On each backplane frame row, the five codewords can be mapped using different methods, examples of which are described below. Note that other methods are possible and are within the scope of the present disclosure.

Figure 4:
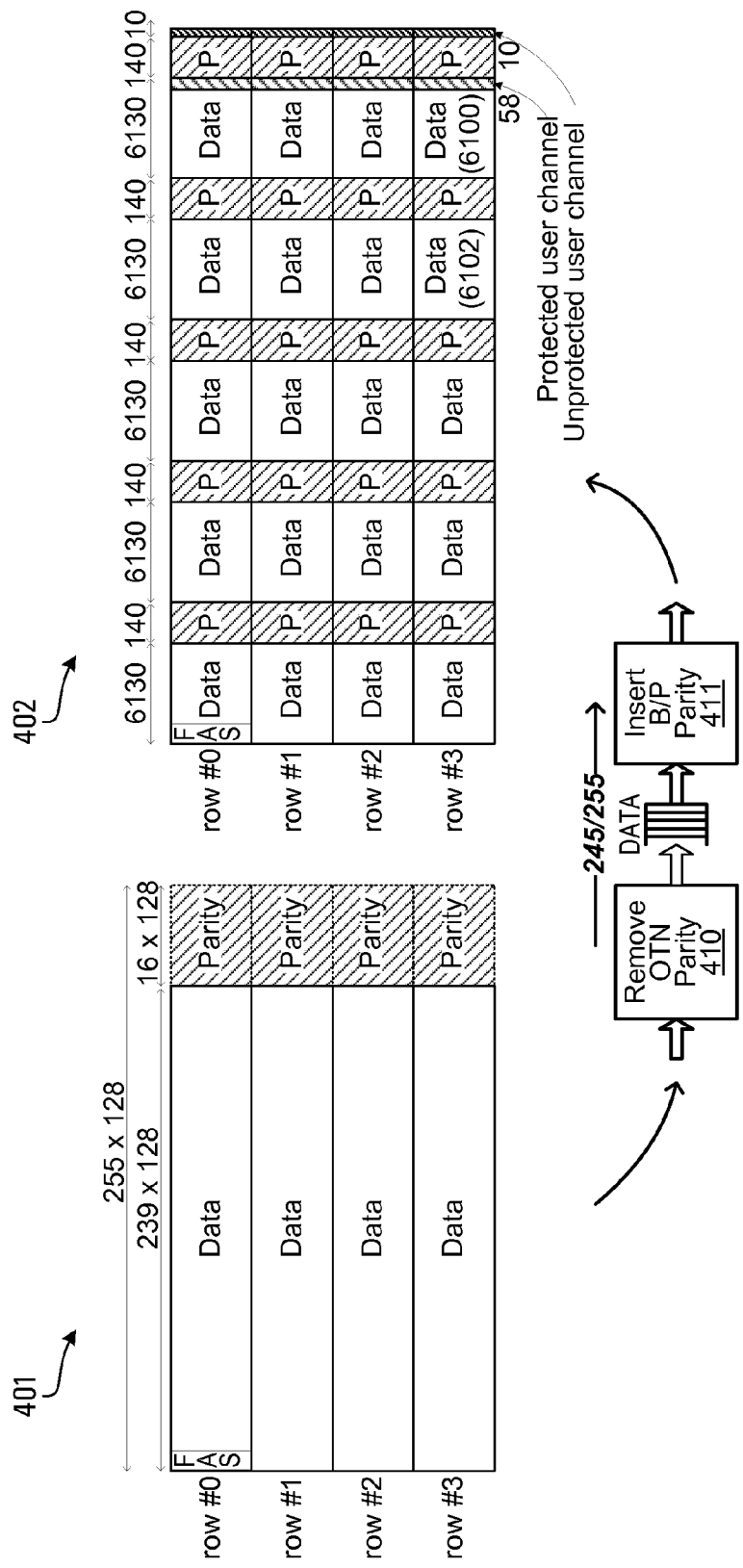
FIG. 4 is a schematic showing details of frame generation in accordance with a first embodiment of the present disclosure for a case of no codeword interleaving by the OTL.

A first method involves mapping the five codewords on a sequential (non-interleaved) fashion. A schematic showing details of frame generation in accordance with the first embodiment is shown in FIG. 4. The frame generation involves circuitry 410 for removing FEC parity from an OTN frame 401 (and optionally removing OTN FAS bytes—Frame Alignment Signal), and circuitry 411 for re-structuring data from the OTN frame 401 and creating FEC parity locations (and optionally inserting the backplane FAS bytes if they were removed by the circuitry 410) for a new backplane frame format 402.

Figure 5:
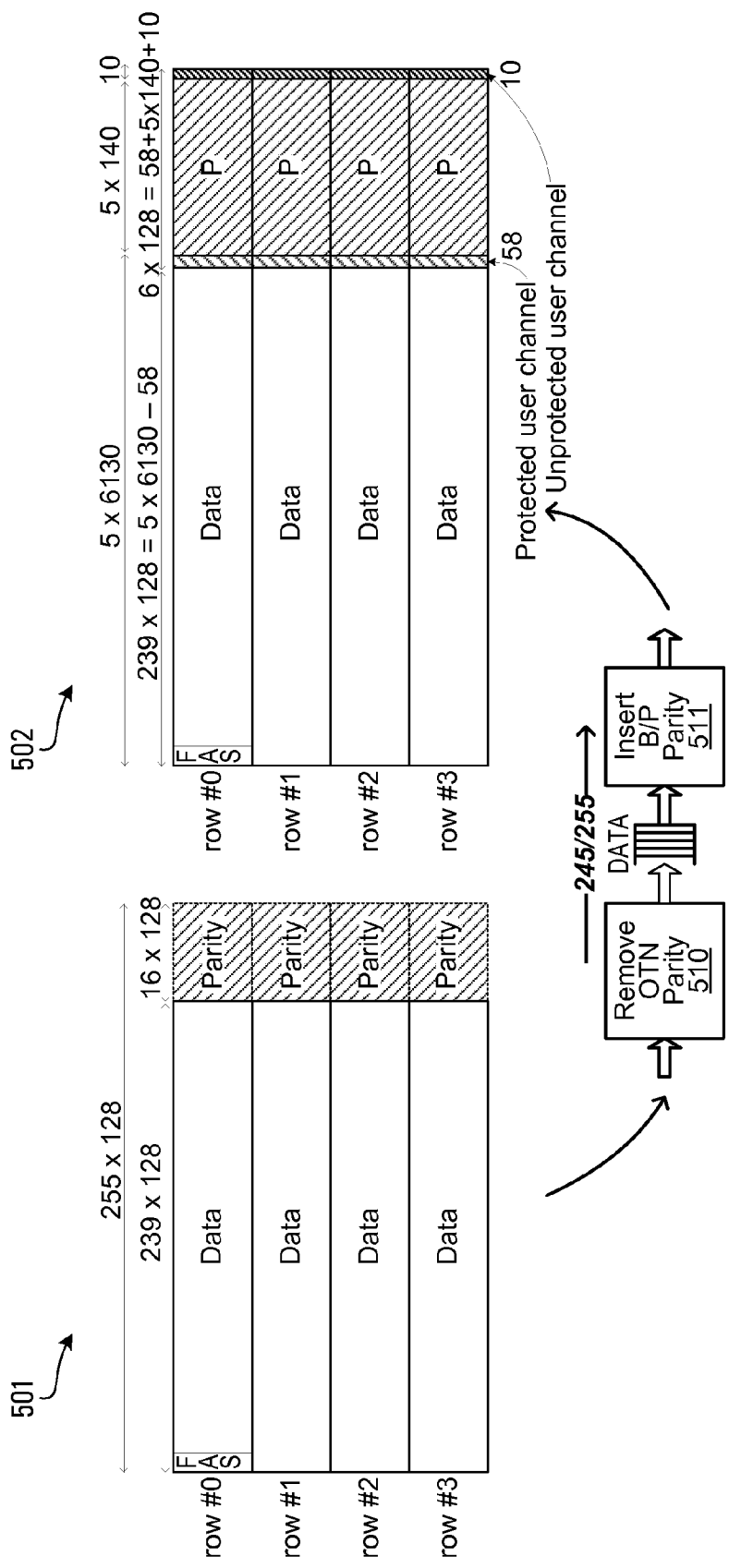
FIG. 5 is a schematic showing details of frame generation in accordance with the first embodiment of the present disclosure for a case of codeword interleaving by the OTL.

A second method involves mapping the five codewords on a symbol-interleaved fashion. A schematic showing details of frame generation in accordance with the first embodiment is shown in FIG. 5. The frame generation involves circuitry 510 for removing FEC parity from an OTN frame 501 (and optionally removing OTN FAS bytes—Frame Alignment Signal), and circuitry 511 for re-structuring data from the OTN frame 501 and creating FEC parity locations (and optionally inserting the backplane FAS bytes if they were removed by the circuitry 510) for a new backplane frame format 502.

Note that the re-structuring of data can reduce latency (even though the FIFO might introduce some latency) because there is less data to receive before processing with FEC parity can be started. Note that the FEC parity from the OTN frame is discarded, as new FEC parity for the 20 codewords is calculated with RS because of the restructuring of the data.

FIGS. 4 and 5 show conversion of a standard OTN frame 401,501 having 255 column groups per OTN frame row into a proprietary OTN frame 402,502 having 245 column groups per OTN frame row. The number of available parity bits per OTN from row for the standard OTN frame is 16×128 bits. The number of available parity bits per OTN from row for the proprietary OTN frame 402,502 is 6×128 bits (i.e. 245−239=6).

According to the first embodiment, five RS (627,613,t=7, m=10) codewords are mapped into each row of the OTN backplane frame. This results in the following length mismatch:

Available parity=6×128 bit=768 bits
Parity to use=5×140 bit=700 bits
Protected data=5×613×10 bits=30,650 bits
Data to protect=239×128 bits=30,592 bits To address the length mismatch in parity, the 68 (i.e. 768−700) unused parity bits are split into two groups:

58 bits (i.e. 30,650−30,592) are used as a protected user channel, and
the remaining 10 bits (i.e. 68−58) are used as an unprotected user channel.

There are special considerations for the FEC parity calculation with RS because the OTL involves bit shuffling. With reference back to the FEC encoder/decoder 300 shown in FIG. 3, there is circuitry 312 for bit shuffling before RS encoding and circuitry 314 for bit re-shuffling after the RS coding. The bit shuffling and the bit re-shuffling is performed in a manner that compensates for the bit shuffling done by the OTL. In some implementations, this is performed such that there is symbol striping across multiple lanes despite the bit shuffling done by the OTL. The bit shuffling by the OTL will be explained in further detail with reference to FIGS. 6 and 7 for an example case of 5× codeword interleaving, followed by example details of how to compensate for the bit shuffling. Further details of bit shuffling by the OTL can be found in Appendix A below and in ITU G.709.

Figure 6:
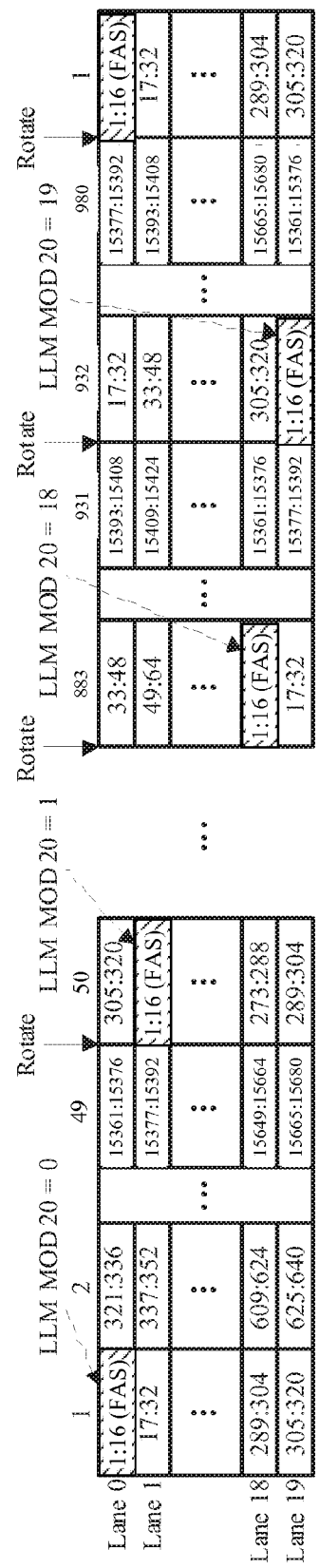
FIG. 6 is a schematic showing details of data processing by the OTL for the first embodiment of the present disclosure.

FIG. 6 shows how the OTL distributes 16-byte groups into a plurality of logical lanes. Each 16-byte group is distributed, round robin, to each logical lane. In the illustrated example, it is assumed that there are 20 logical lanes. However, other implementations are possible in which there may be a different number of logical lanes. In this implementation, each frame has 980 16-byte groups and there are 20 logical lanes, so there are 49 16-byte groups distributed to each logical lane.

Logical lane assignments are rotated on each frame boundary. Thus, sequential frames differ in terms of how the 16-byte groups are distributed. For each frame, the third OA2 byte position (i.e. sixth byte position in the frame) is used to carry an LLM (Logical Lane Marker), which indicates how the 16-byte groups of the frame have been distributed. The LLM increments on successive frames, from 0 to 239, but since there are only 20 logical lanes, there are only 20 unique distributions. The logical lane number is recovered from the third 0A2 value by a "modulo 20" operation.

Figure 7:
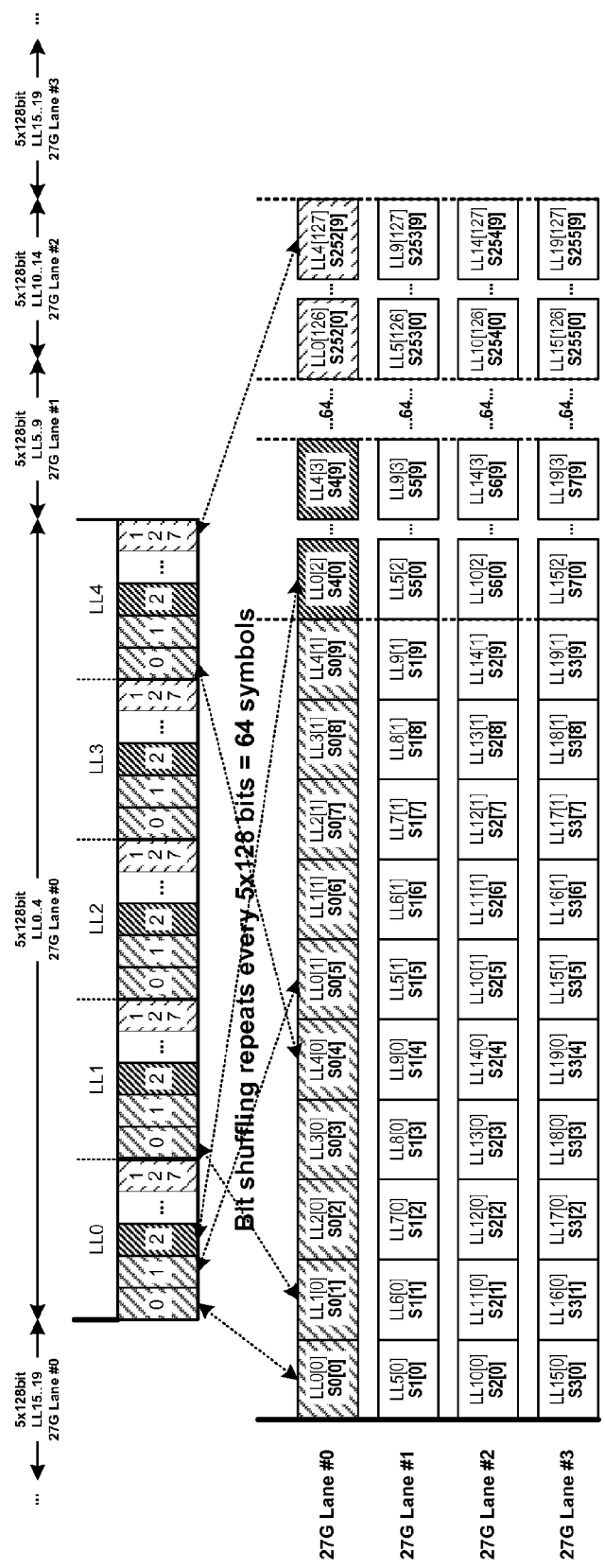
FIG. 7 is a schematic showing details of bit shuffling by the OTL with codeword interleaving for the various embodiments of the present disclosure.

FIG. 7 shows bit-shuffling by the OTL from the logical lanes into 28 G physical lanes. In the illustrated example, such bit-shuffling is accomplished using four multiplexers (one for each physical lane). Each multiplexer performs bit-interleaving of data from five logical lanes (i.e. 5× codeword interleaving). While the interleaving is accomplished using four multiplexers, other implementations are possible in which there may be a different number of multiplexers.

Figure 8:
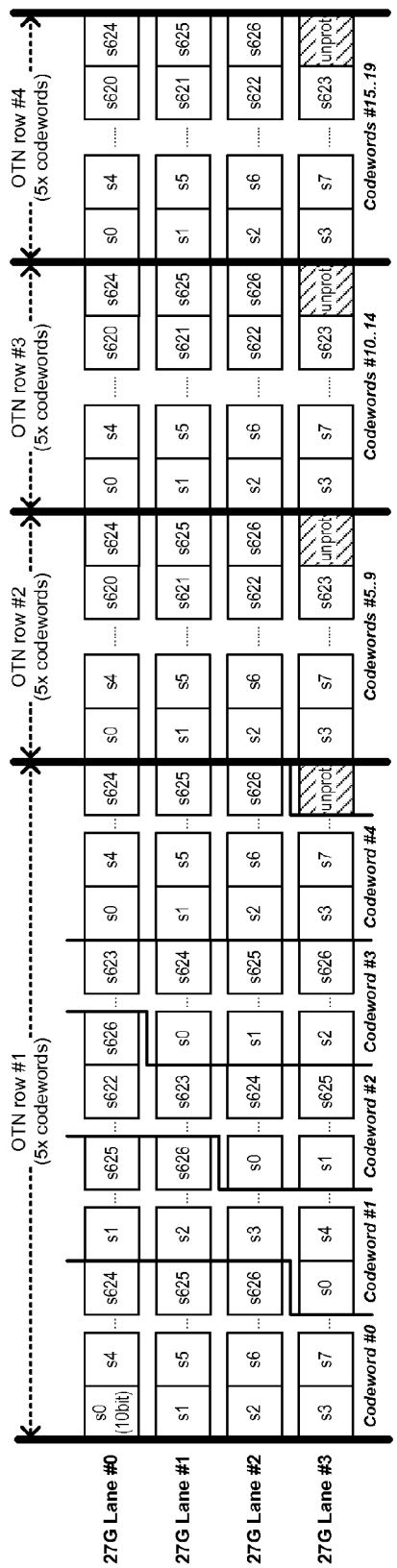
FIG. 8 is a schematic showing details of symbol striping for a case of codeword interleaving by the OTL, in accordance with the first embodiment of the present disclosure.

The FEC parity calculation should compensate for the bit shuffling done by the OTL so that we get striping at the symbol level across the four 27 G backplane lanes as shown in FIG. 7 and FIG. 8. Such striping can increase tolerance against burst errors that may be experienced at the output of a DFE of the receiving device. Thus, as noted above with reference to FIG. 3, there is circuitry 312 for bit shuffling before the RS coding and circuitry 323 for bit re-shuffling after the RS coding in order to compensate for the bit shuffling done by the OTL. In other words, the Reed Solomon parity symbols are computed over a bit-shuffled version of the OTN backplane frame. In this specific embodiment, the parity calculation is with RS (627,613,t=7, m=10) over $GF(2^{10})$. More generally, any suitable FEC parity calculation can be employed, whether RS-based or not.

In specific implementations, the circuitry 312 for bit shuffling operates over a 5×128 bits=640 bits=64 symbol window. Each group of 5×128 bits is mapped into 64 10-bit symbols. The same bit shuffling pattern repeats every 5×128 bits=80 bytes=64 symbols. In specific implementations, each group of 20×128 bits (bit[LL][n], LL=0 . . . 19, n=0 . . . 127) is mapped into 256 10-bit symbols (symbol [S][m], s=0 . . . 255, m=0 . . . 9) as follows:

sym[S][m]←bit[LL][n]
S=4*floor(n/2)+floor(LL/5)
m=5*(n mod 2)+(LL mod 5).

Furthermore, each group of 256 10-bit symbols (symbol[S][m], s=0 . . . 255, m=0 . . . 9) is mapped into 20×128 bits (bit[LL][n], LL=0 . . . 19, n=0 . . . 127) as follows:

bit[LL][n]←sym[S][m]
LL=5*(S mod 4)+(m mod 5)
n=2*floor(S/4)+floor(m/5).

Note that this is a very specific example and that other bit shuffling schemes are within the scope of this disclosure. More generally, any suitable bit shuffling that compensates for the bit shuffling done by the OTL can be implemented. Note that the OTL could interleave the logical lanes into the electrical lanes in many different ways. Thus, there may be corresponding bit shuffling/de-shuffling compensation methods that can be implemented by the circuitry 312,314. The example shown in FIG. 7 involves interleaving LL0/

LL1//L2/LL3/LL4 into electrical lane #0, but this could be done in a different way. For example, in alternative implementations, the OTL interleaves LL0/LL4/LL8/LL12/LL16 into electrical lane #0. This would involve a different bit shuffling/de-shuffling compensation method by the circuitry 312,314.

Figure 9:
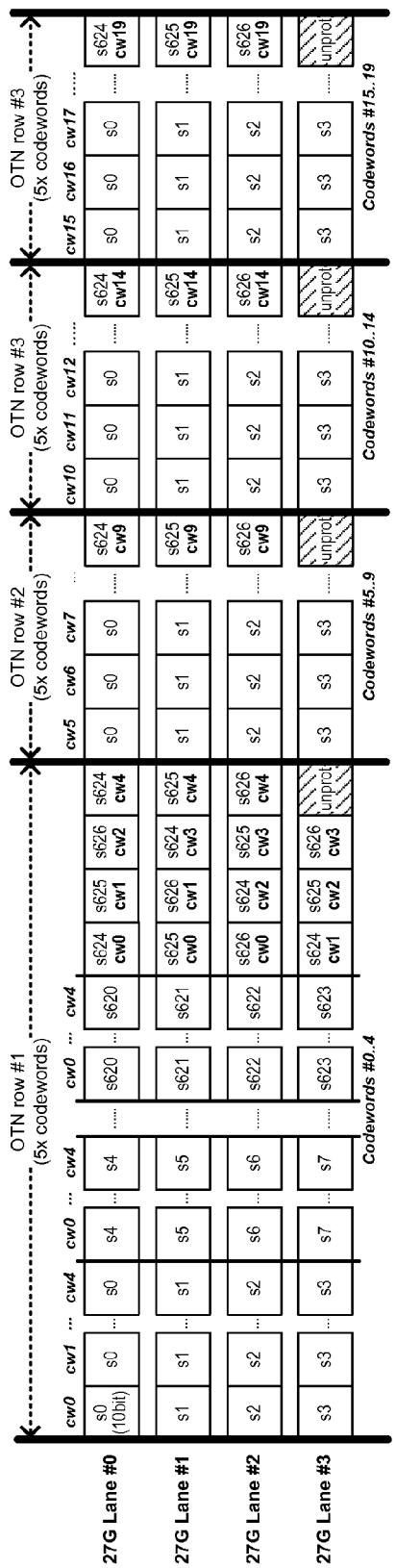
FIG. 9 is a schematic showing details of symbol striping for a case of no codeword interleaving by the OTL, in accordance with the first embodiment of the present disclosure.

In the alternative case of no codeword interleaving by the OTL, the FEC parity calculation should still compensate for the bit shuffling done by the OTL so that we get striping at the symbol level across the four 27 G backplane lanes as shown in FIG. 9. Details of the bit shuffling done by the OTL for the case of no codeword interleaving are not shown.

Note that Appendix II of G.709 fails to teach of a functionally standardized OTUk with a smaller OTUkV FEC according to the present disclosure. Furthermore, Appendix II of G.709 fails to teach the RS encoding with the foregoing bit shuffling function that compensates for the bit shuffling done by the OTL.

FEC Encoder/Decoder: Second Embodiment

According to a second embodiment, data of an OTN frame (for example, an OTN frame with a 255/239 FEC redundancy) is re-structured into another OTN frame (the backplane frame) with a 245.5/239 FEC redundancy. The backplane frame is structured similarly to a standard OTN frame: 9820 byte×4 rows=7856 symbol×4 row. Ten rows on the incoming OTN frames are mapped into each backplane frame.

Fifteen Reed Solomon codewords are mapped into each row of the backplane frame; this is, fourteen RS (528,514, m=10,t=7) codewords plus a shortened RS (464, 450,m=10, t=7) codeword.

A FIFO is used for the re-structuring. On each backplane frame row, the fifteen codewords can be mapped using one of two different methods:

By mapping the fifteen codewords on a sequential (non-interleaved) fashion.

By interleaving the codewords at the symbol level.

Note that the re-structuring of data can reduce latency (even though the FIFO might introduce some latency) because there is less data to receive before processing with FEC parity can be started. Note that the FEC parity from the incoming OTN frame is discarded, as new FEC parity for the fifteen codewords is calculated with RS (Reed Solomon) because of the restructuring of the data.

The OTN FAS bytes (6×8×10/4=120 bits per BP frame) are "borrowed" to carry the BP frame FAS (40 bits) and parity (80 bits):

Available parity=10×6.5×128 bits+80 bits [extra parity]
=8,400 bits

Parity to use=15×4×140 bits=8,400 bits

Protected data=15×4×5140 bits=308,400 bits

Data to protect=10×239×128 bits−80 bits [extra parity]
=305,840 bits

Note that (308,400−305,840)/10=256 symbols, so every backplane frame row, one of the fifteen codewords is shortened by 256/4=64 symbols.

There are special considerations for the FEC parity calculation with RS because the OTL involves bit shuffling as explained for the first embodiment. The FEC parity calculation should compensate for the bit shuffling done by the OTL so that we get striping at the symbol level across the four 27 G backplane lanes. Examples are shown for the first embodiment in FIGS. 7 and 8 for the case of 5× codeword interleaving and in FIG. 9 for the case of no codeword interleaving. The second embodiment similarly entails striping at the symbol level across the four 27 G backplane lanes, with or without codeword interleaving.

Such striping can increase tolerance against burst errors that may be experienced at the output of a DFE of the receiving device. Thus, as noted above with reference to FIG. 3, there is circuitry 312 for bit shuffling before the RS coding and circuitry 323 for bit re-shuffling after the RS coding in order to compensate for the bit shuffling done by the OTL. In other words, the Reed Solomon parity symbols are computed over a bit-shuffled version of the OTN backplane frame. In this specific embodiment, the FEC parity calculation is with RS (528,514,t=7,m=10) over GF($2^{10}$). More generally, any suitable FEC parity calculation can be employed, whether RS-based or not.

In specific implementations, circuitry 312 for bit shuffling operates over a 5×128 bits=640 bits=64 symbol window. Each group of 5×128 bits is mapped into 64 10-bit symbols. The same bit shuffling pattern repeats every 5×128 bits=80 bytes=64 symbols. In specific implementations, each group of 20×128 bits (bit[LL][n], LL=0 . . . 19, n=0 . . . 127) is mapped into 256 10-bit symbols (symbol[S][m], s=0 . . . 255, m=0 . . . 9) as follows:

sym[S][m]←bit[LL][n]
S=4*floor(n/2)+floor(LL/5)
m=5*(n mod 2)+(LL mod 5).

Furthermore, each group of 256 10-bit symbols (symbol[S][m], s=0 . . . 255, m=0 . . . 9) is mapped into 20×128 bits (bit[LL][n], LL=0 . . . 19, n=0 . . . 127) as follows:

bit[LL][n]←sym[S][m]
LL=5*(S mod 4)+(m mod 5)
n=2*floor(S/4)+floor(m/5).

Note that this is a very specific example and that other bit shuffling schemes are within the scope of this disclosure. More generally, any suitable bit shuffling that compensates for the bit shuffling done by the OTL can be implemented. Note that the OTL could interleave the logical lanes into the electrical lanes in many different ways. Thus, there may be corresponding bit shuffling/de-shuffling compensation methods that can be implemented by the circuitry 312,314. The example shown in FIG. 7 involves interleaving LL0/LL1/L2/LL3/LL4 into electrical lane #0, but this could be done in a different way. For example, in alternative implementations, the OTL interleaves LL0/LL4/LL8/LL12/LL16 into electrical lane #0. This would involve a different bit shuffling/de-shuffling compensation method by the circuitry 312,314.

Note that Appendix II of G.709 fails to teach of a functionally standardized OTUk with a smaller OTUkV FEC according to the present disclosure. Furthermore, Appendix II of G.709 fails to teach the RS encoding with the foregoing bit shuffling function that compensates for the bit shuffling done by the OTL.

FEC Encoder/Decoder: Third Embodiment

According to a third embodiment, data of an OTN frame (for example, an OTN frame with a 255/239 FEC redundancy) is re-structured into another OTN frame (the backplane frame) with a 242.5/239 FEC redundancy. The backplane frame is structured similarly to a standard OTN frame with four rows and 2425×128 bits per row. Ten incoming OTN frames are mapped into each backplane frame.

Thirty-two RS (970,956,m=10,t=7) codewords are mapped into each row of the backplane frame. A FIFO is used for the re-structuring. On each backplane frame row, the thirty-two RS codewords can be mapped using one of two different methods:

By mapping the thirty-two codewords on a sequential (non-interleaved) fashion.

By interleaving the codewords at the symbol level (4× codeword interleaving, 8× codeword interleaving, etc.).

Note that the re-structuring of data can reduce latency (even though the FIFO might introduce some latency) because there is less data to receive before processing with FEC parity can be started. Note that the FEC parity from the incoming OTN frame is discarded, as new FEC parity for the 32 codewords (per backplane frame row) is calculated with RS (Reed Solomon) because of the restructuring of the data.

In this third embodiment, the amount of OTN data and parity bits match the number of bits on the RS codewords:

Available parity (per backplane row)=10×3.5×128 bits=4,480 bits
Parity to use (per backplane row)=32×140 bits=4,480 bits
Protected data (per backplane row)=32×9560 bits=305,920 bits
Data to protect (per backplane row)=10×239×128 bits=305,920 bits A number of OTN FAS bytes (for example, one OTN FAS byte per OTN frame) is "borrowed" to carry the backplane frame FAS bytes.

There are special considerations for the FEC parity calculation with RS because the OTL involves bit shuffling as explained for the first embodiment. The FEC parity calculation should compensate for the bit shuffling done by the OTL so that we get striping at the symbol level across the four 27 G backplane lanes. Examples are shown for the first embodiment in FIGS. 7 and 8 for the case of 5× codeword interleaving and in FIG. 9 for the case of no codeword interleaving. The third embodiment similarly entails striping at the symbol level across the four 27 G backplane lanes, with or without codeword interleaving.

Such striping can increase tolerance against burst errors that may be experienced at the output of a DFE of the receiving device. Thus, as noted above with reference to FIG. 3, there is circuitry 312 for bit shuffling before the RS coding and circuitry 323 for bit re-shuffling after the RS coding in order to compensate for the bit shuffling done by the OTL. In other words, the Reed Solomon parity symbols are computed over a bit-shuffled version of the OTN backplane frame. In this specific embodiment, the FEC parity calculation is with RS (970,956,t=7,m=10) over GF(2^10). More generally, any suitable FEC parity calculation can be employed, whether RS-based or not.

In specific implementations, the circuitry 312 for bit shuffling operates over a 5×128 bits=640 bits=64 symbol window. Each group of 5×128 bits is mapped into 64 10-bit symbols. The same bit shuffling pattern repeats every 5×128 bits=80 bytes=64 symbols. In specific implementations, each group of 20×128 bits (bit[LL][n], LL=0 . . . 19, n=0 . . . 127) is mapped into 256 10-bit symbols (symbol [S][m], s=0 . . . 255, m=0 . . . 9) as follows:

sym[S][m]←bit[LL][n]
S=4*floor(n/2)+floor(LL/5)
m=5*(n mod 2)+(LL mod 5).

Furthermore, each group of 256 10-bit symbols (symbol[S][m], s=0 . . . 255, m=0 . . . 9) is mapped into 20×128 bits (bit[LL][n], LL=0 . . . 19, n=0 . . . 127) as follows:

bit[LL][n]←sym[S][m]
LL=5*(S mod 4)+(m mod 5)
n=2*floor(S/4)+floor(m/5).

Note that this is a very specific example and that other bit shuffling schemes are within the scope of this disclosure. More generally, any suitable bit shuffling that compensates for the bit shuffling done by the OTL can be implemented. Note that the OTL could interleave the logical lanes into the electrical lanes in many different ways. Thus, there may be corresponding bit shuffling/de-shuffling compensation methods that can be implemented by the circuitry 312,314.

The example shown in FIG. 7 involves interleaving LL0/LL1/L2/LL3/LL4 into electrical lane #0, but this could be done in a different way. For example, in alternative implementations, the OTL interleaves LL0/LL4/LL8/LL12/LL16 into electrical lane #0. This would involve a different bit shuffling/de-shuffling compensation method by the circuitry 312,314.

Note that Appendix II of G.709 fails to teach of a functionally standardized OTUk with a smaller OTUkV FEC according to the present disclosure. Furthermore, Appendix II of G.709 fails to teach the RS encoding with the foregoing bit shuffling function that compensates for the bit shuffling done by the OTL.

Although specific embodiments have been disclosed in detail, it is to be understood that other embodiments are possible and are within the scope of this disclosure. In general, systems and methods are provided for modifying an existing OTN frame (or creating a new frame with data from the OTN frame) prior to transmission. The precise manner in which this is accomplished is implementation specific.

Example Highlights of Embodiments

Note that the foregoing embodiments may allow the backplane lane rate may be reduced. For instance, a client OTN frame, based on the standard 255/239 OTN frame structure, is mapped into an OTN backplane frame based on a (lower rate) 245/239 frame structure (i.e. Backplane_frame_rate=OTN_frame_rate×245/255). Thus, the OTN backplane rate is approximately 4% lower than the OTN signal rate. This may be important for 28 G electricals.

Additional example highlights are listed below.
compatible with ITU-T G.709 OTL4.n method (and the future OTLC.n method) to allow hardware reuse
Supports the de-aggregation of the 27 G lanes into 5 G logical lanes (as per ITU-T G.709 OTL4.4/OTL4.10 specification)
Different interleaving options are supported for the mapping of the RS codewords into the OTN frame rows:
no codeword interleaving, to reduce latency.
codeword interleaving, interleaved at the symbol level, to increase the tolerance against burst errors.

Table 1 shows Net Coding Gain of the OTN backplane FEC compared to the standard G.709 RS FEC (GFEC).

TABLE 1

| Net coding gain (in absence of DFE burst errors) | | | |
|---|---|---|---|
| | Coding rate | NCG | BERin (at BERout = $10^{-15}$) |
| OTN backplane FEC (first embodiment) | 2.51% | 5.59 dB | 1.89E−5 |
| OTN backplane FEC (second embodiment) | 2.72% | 5.65 dB | 2.19E−5 |
| OTN backplane FEC (this disclosure) | 1.46% | 5.44 dB | 1.19E−5 |
| GFEC 7% (G.709) | 6.7% | 6.19 dB | 8.28E−5 |

From this chart it can be seen that the OTN backplane FEC can offer benefits over the standard G.709 RS (255,239,t=8, m=8) FEC because it can provide a good coding gain (5.59/5.65/5.44dB vs. 6.19 dB) with comparatively low coding rate (2.51/2.72/1.46% vs. 6.7%). This can be shown by a technical term called "Gap to Capacity".

TABLE 2 compares the "gap to capacity" of the first embodiment of the OTN backplane FEC and the standard G.709 FEC (GFEC) at BERout=1E-12 and BERout=1E-15.

TABLE 2

| Gap to capacity | | |
|---|---|---|
| | Gap to capacity | |
| | BERout = $10^{-12}$ | BERout = $10^{-15}$ |
| OTN backplane FEC (-first embodiment) | 2.75 dB | 3.2 dB |
| GFEC 7% (G.709) | 3.3 dB | 3.78 dB |

The backplane lane rate is calculated as follows:
 first embodiment: OTN backplane lane rate=OTN client rate/4×245 /255
 second embodiment: OTN backplane lane rate=OTN client rate/4×245.5 /255
 third embodiment: OTN backplane lane rate=OTN client rate/4×242.5 /255

TABLE 3 shows the 25 G-class lane rate of the OTN backplane, for the first embodiment, for different base frequency options (i.e. SONET_rate×255/227, SONET_rate×255/226, etc.). The 255/227 ratio corresponds to an OTU4 client signal. The 255/226, 255/225.5 and 255/225 ratios correspond to potential candidates for the future OTUCn ("beyond 100 G" OTN rates).

TABLE 3

| OTN backplane FEC (first embodiment) Lane rate for different OTN client rate options | |
|---|---|
| OTN client rate = = SONET rate × 255/R [R = 225, 226, 227, etc.] | OTN backplane lane rate = OTN client rate × 245/255 |
| SONET × 255/227 = 4 × 27.95249 Gbps | 26.85632 Gbps |
| SONET × 255/226 = 4 × 28.07618 Gbps | 26.97515 Gbps |
| SONET × 255/225.5 = 4 × 28.13843 Gbps | 27.03496 Gbps |
| SONET × 255/225 = 4 × 28.20096 Gbps | 27.09504 Gbps |

A property of the present disclosure is that it supports both 100 and 25 G class lanes, since it still uses 5 G logical lanes. By comparison, the 100 GE backplane (802.3bj) cannot do that: the 25 G lanes are monolithic, do not consist of five 5 G virtual lanes. This "property" is a result of reusing the OTL4.4 definition.

Appendix A

In general, OTLk.n allows OTUk (e.g. k=4) over n parallel lanes. As per G.709, OTLk.n refers to each of the n parallel lanes. For example, OTL4.4 refers to one of the four ~27 G lanes used to carry an OTU4. However, experts commonly use the term OTL (or OTLk.n) to refer to the entire parallel interface, or to refer to the "method" used to inverse the OTUk over a parallel interface (the OTL method). The OTN backplane frame is structured similarly to an OTN frame (for example, 245 groups of 128 bits per row, i.e. 245 column groups, for the first embodiment) and is inversed multiplexed over the four 27 G backplane lanes by using the OTL4.4 method (ITU G.709).

The inverse multiplexing of an OTUk frame (with an OTUkV FEC having a smaller redundancy than the G.709 FEC) into n OTLk.n lanes causes the bit shuffling. Basically the OTN frame <-> nx OTL electrical B/P lanes. As defined in ITU G.709, the OTL4.4 function stripes the frame into 20×128 bit groups (i.e. 20× column groups, each corresponding to a different 5 G logical lane), and bit-interleaves five 5 G logical lanes into each of the four 27 G OTN backplane lanes. FIG. 6 (corresponding to the first embodiment), shows how the OTN backplane frame is inversed multiplexed over twenty 5 G logical lanes. FIG. 7 shows details of bit shuffling by the transmitting OTL. This Figure shows how sequential bits of the OTN frame are mapped into the Reed Solomon symbols, and how the Reed Solomon symbols are striped across the four 27 G backplane lanes.

Most OTN acronyms used in this disclosure can be found in Section 4 of ITU-T G.709 recommendation (interfaces for the optical transport network):

OTUk (Completely standardized Optical Channel Transport Unit-k):
  The OTUk frame is the OTN transport frame with a standardized OTN FEC (as the G.709 RS (255,239) FEC) that is referred in this document
 OTUkV (Functionally standardized Optical Channel Transport Unit-k):
  The OTUkV frame is the OTN transport frame with a non standardized OTN FEC (as the other FEC schemes mentioned in this document) that is referred in this document
 OTL (Optical Channel Transport Lane):
  An OTUk (or OTUkV) signal can be carried over a Multilane interface with n OTLk.n (or OTLkV.n) electrical or optical transport lanes/signals. The OTL terms mentioned in this document can refer to either an OTLk(V).n lane or the whole OTLk(V).n Multilane interface.

The GFEC acronym used in this disclosure refer to the standard OTN G.709 RS (255,239) FEC ("G" is for G.709).

The OTUk (or OTUkV) transport frame can be inversely multiplexed (by 16 Byte chunk granularity) into n OTLk.n (or OTLkV.n) Logical Lanes as specified in Annex C of G.709 for k=4 and k=3. A similar scheme can be applied to other values of k, such as k=Cn. Then, multiple OTLk.n (or OTLkV.n) Logical Lanes are bit-multiplexed into an OTLk.n (or OTLkV.n) Optical Transport Lane as shown in FIG. 6.5 and FIG. 8.3 of ITU-T G.709. FIGS. 6.5 and 8.3 of ITU-T G.709 along with their related descriptions are expressly incorporated by reference.

For example, in the case of k=4 (OTU4, 111 809 973.568 kbit/s signal bit rate roughly), the value L=20 and the value n=4 (OTL4.4, 27 952 493.392 kbit/Lane bit rate roughly, see table 7-5 or FIG. 6.5 or ITU-T G.709) or n=10 (OTL4.10, 11 180 997.3568 kbit/s lane bit rate see Appendix VII of ITU-T G.709) are typically used (and specified) for Optical or Electrical lane transmission. In that essence, the OTU4 signal is inversely multiplexed and carried through either four optical or electrical lanes (OTL4.4) or ten optical or electrical lanes (OTL4.10). Table 7-5 of ITU-T G.709 along with its related description are expressly incorporated by reference.

A goal of some embodiments is to carry an OTN frame signal with a lower redundancy FEC than the G.709 RS (255,239) FEC over a Multilane interface with for example n electrical backplane lanes (OTLk(V).n). For example, in the case of k=4, a standard OTL4.4 Lane bit rate is approximately 27 952 493.392 kbit/s (due to the 6.7% RS (255,239) FEC redundancy) and by using some of the schemes and embodiments described in this disclosure, an OTL4V.4 per lane transmission bit rate of approximately 26 856 317.805 kbit/s can be instead achieved (by using instead the roughly 2.5% RS FEC approach of the present disclosure, that would be an OTUkV FEC with a lower redundancy).

Numerous modifications and variations of the present disclosure are possible in light of the above teachings. It is therefore to be understood that within the scope of the appended claims, the present disclosure may be practised otherwise than as specifically described herein.

We claim:

1. An OTN (Optical Transport Network) transmitter comprising:
   an OTN framer device configure to generate an OTN frame:
   an FEC(Forward Error Correction) encoder circuit configure to code the OTN frame to generate an FEC encoded frame; and
   a transmitting OTL (Optical channel Transport Lane) configured to transport the FEC encoded frame over a communication channel;
   wherein the FEC encoder circuit comprises:
      a re-structuring circuitry configured to remove FEC parity from the OTN frame, re-structure data from the OTN frame, and create new FEC parity locations; and
      a coding circuitry configured to generate FEC parity for the new parity locations thereby generating the FEC encoded frame;
      wherein the coding circuitry is configured to generate the FEC parity in a manner that compensates for bit shuffling performed by the transmitting OTL.

2. The OTN transmitter of claim 1, wherein the coding circuitry is configured to generate the FEC parity while compensating for bit shuffling done by the OTL such that data striping is achieved at a symbol level across physical lanes of the communication channel despite inverse multiplexing of the FEC encoded frame by the transmitting OTL.

3. The OTN transmitter of claim 2, wherein the coding circuitry is configured to compensate for bit shuffling done by the transmitting OTL by bit shuffling the data before generating the FEC parity and by bit de-shuffling after generating the FEC parity.

4. The OTN transmitter of claim 3, wherein:
   bit shuffling the data before generating the FEC parity comprises, for each group of 20×128 bits (bit[LL] [n], LL=0 . . . 19, n=0 . . . 127), mapping the group into 256 10-bit symbols (symbol[S] [m], s=0 . . . 255, m=0 . . . 9) by implementing the following algorithm:
      symbol[S] [m]←bit[LL] [n]
         S=4*floor(n/2)+floor(LL/5)
         m=5*(n mod 2)+(LL mod 5); and
   bit de-shuffling the data after generating the FEC parity comprises, for each group of 256 10-bit symbols (symbol[S] [m], s=0 . . . 255, m=0 . . . 9), mapping the group into 20×128 bits (bit[LL] LL=0 . . . 19, n=0 . . . 127) by implementing the following algorithm:
      bit[LL][n] symbol[S][m]
         LL=5*(S mod 4)+(m mod 5)
         n=2*floor(S/4)+floor(m/5).

5. The OTN transmitter of claim 1, wherein the coding circuitry comprises an RS (Reed Solomon) encoder for generating the FEC parity.

6. The OTN transmitter of claim 5, wherein the re-structuring circuitry is configured to re-structure the OTN frame, which is initially structured with sixteen RS (255, 239,m=8,t=8) per OTN frame row, into a new FEC structure having five RS (627,613,m=10,t=7) per OTN frame row.

7. The OTN transmitter of claim 5, wherein the re-structuring circuitry is configured to re-structure the OTN frame, which is initially structured with sixteen RS(255,239, m=8,t=8) per OTN frame row, into a new FEC structure having fifteen RS (528,514,m=10,t=7) per OTN frame row.

8. The OTN transmitter of claim 5, wherein the re-structuring circuitry is configured to re-structure the OTN frame, which is initially structured with sixteen RS(255,239, m=8,t=8) per OTN frame row, into a new FEC structure having thirty-two RS (970,956,m=10,t=7) per OTN frame row.

9. The OTN transmitter of claim 1, wherein the re-structuring circuitry is configured to remove FAS (Frame Alignment Signal) bytes from the OTN frame and inserting new FAS bytes into the OTN frame.

10. The OTN transmitter of claim 1, further comprising:
    a receiving OTL configured to receive an second FEC frame: and
    decoding circuitry that is complementary to the re-structuring circuitry and the coding circuitry, the decoding circuitry being configured to process the second FEC encoded frame.

11. The OTN transmitter of claim 1, comprising an FPGA (Field Programmable Gate Array) that implements at least the OTN framer device.

12. A method for execution by an OTN (Optical Transport Network) transmitter, the method comprising:
    generating, by an OTN framer device, an OTN (Optical Transport Network) frame;
    coding, by an FEC (Forward Error Correction) encoder circuit, the OTN frame to generate an FEC encoded frame: and
    transmitting, by a transmitting OTL (Optical channel Transport Lane), the FEC encoded frame over a communication channel:
    wherein coding the OTN frame to generate the FEC encoded frame comprises:
      removing FEC (Forward Error Correction) parity from the OTN frame;
      re-structuring data from the OTN frame;
      creating new FEC parity locations; and
      generating FEC parity for the new FEC parity locations thereby generating the FEC encoded frame;
      wherein generating the FEC parity is executed in a manner that compensates for bit shuffling performed by the transmitting OTL.

13. The method of claim 12, comprising:
    generating the FEC parity while compensating for bit shuffling done by the transmitting OTL such that data striping is achieved at a symbol level across physical lanes of the communication channel despite inverse multiplexing of the FEC encoded frame by the transmitting OTL.

14. The method of claim 13, wherein compensating for bit shuffling done by the transmitting OTL comprises:
    bit shuffling the data before generating the FEC parity; and
    bit de-shuffling after generating the FEC parity.

15. The method of claim 14, wherein:
    bit shuffling the data before generating the FEC parity comprises, for each group of 20×128 bits (bit[LL] LL=0 . . . 19, n=0 . . . 127), mapping the group into 256 10-bit symbols (symbol[S][m], s=0 . . . 255, m=0 . . . 9) by implementing the following algorithm:
       symbol[S] [m]←bit[LL] [n]
          S=4*floor(n/2)+floor(LL/5)
          m=5*(n mod 2)+(LL mod 5); and
    bit de-shuffling the data after generating the FEC parity comprises, for each group of 256 10-bit symbols (symbol[S] [m], s=0 . . . 255, m=0 . . . 9), mapping the group into 20×128 bits (bit[LL][n], LL=0 . . . 19, n=0 . . . 127) by implementing the following algorithm:
bit[LL][n]←symbol[S][m]
  LL=5*(S mod 4)+(m mod 5)
  n=2*floor(S/4)+floor(m/5).

16. The method of claim 12, wherein generating the FEC parity comprises an RS (Reed Solomon) encoder generating the FEC parity.

17. The method of claim 16, comprising:
re-structuring the OTN frame, which is initially structured with sixteen RS (255,239,m=8,t=8) per OTN frame row, into a new FEC structure having five RS (627, 613,m=10,t=7) per OTN frame row.

18. The method of claim 16, comprising:
re-structuring the OTN frame, which is initially structured with sixteen RS(255,239,m=8,t=8) per OTN frame row, into a new FEC structure having fifteen RS (528,514,m=10,t=7) per OTN frame row.

19. The method of claim 16, comprising:
re-structuring the OTN frame, which is initially structured with sixteen RS(255,239,m=8,t=8) per OTN frame row, into a new FEC structure having thirty-two RS (970,956,m=10,t=7) per OTN frame row.

20. The method of claim 12, further comprising:
removing FAS (Frame Alignment Signal) bytes from the OTN frame; and
inserting new FAS bytes into the OTN frame transmission by the transmitting OTL.

21. The method of claim 12, wherein the OTN transmitter comprises an FPGA (Field Programmable Gate Array) that implement at least the OTN framer device.

22. An OTN (Optical Transport Network) system comprising:
a first OTN card comprising:
  an OTN framer device configured to generate an OTN frame;
  an FEC (Forward Error Correction) encoder circuit configured to code the OTN frame to generate an FEC encoded frame; and
  a transmitting OTL (Optical channel Transport Lane) configured to transmit the FEC encoded frame over a communication channel;
  wherein the FEC encoder circuit comprises:
    a re-structuring circuitry configured to remove FEC parity from the OTN frame, re-structure data from the OTN frame, and create new FEC parity locations; and
    a coding circuitry configured to generate FEC parity for the new parity locations thereby generating the FEC encoded frame;
      wherein the coding circuitry is configured to generate the FEC parity in a manner that compensates for bit shuffling performed by the transmitting OTL;
an OTN backplane through which the communication channel traverses; and
a second OTN card comprising an OTN receiver;
wherein the first OTN card and the second OTN card are connected via the OTN backplane.

23. The OTN system of claim 22, wherein the first OTN card comprises an FPGA (Field Programmable Gate Array) that implement at least the OTN framer device.

* * * * *